United States Patent [19]

Chin et al.

[11] Patent Number: 5,294,312

[45] Date of Patent: Mar. 15, 1994

[54] METHOD FOR PREPARING A MAGNETIC RECORDING MEDIUM

[75] Inventors: Tsung-Shune Chin; Wei-Der Chang; Ming-Cheng Deng, all of Hsinchu, Taiwan

[73] Assignee: National Science Council, Taipei, Taiwan

[21] Appl. No.: 54,516

[22] Filed: Apr. 28, 1993

[51] Int. Cl.$^5$ .............................................. C23C 14/00
[52] U.S. Cl. ............................... 204/192.2; 427/128; 427/130; 427/131; 427/132; 427/380; 427/389.7; 427/404; 427/419.3
[58] Field of Search ...................... 204/192.2; 427/128, 427/131, 132, 130, 380, 380.1, 380.3, 380.5, 389.7, 404, 419.3

[56] References Cited

PUBLICATIONS

Os-doped $\gamma$-Fe$_2$O$_3$ thin films having coercivity and high coercive squareness; O. Ishii et al; J. Appln. Phys. 55 (6) Mar. 15, 1984 pp. 2269-2271.

Formation of Ferrite Thin Films by Vacuum Evaporation with Annealing Process M. Satou et al; IEEE Transactions on Magnetics vol. MAG-13, No. 5, Sep. 1977, pp. 1400-1402.

Magnetic Recording Characteristics of Sputtered $\gamma$-Fe$_2$O$_3$ Thin Film Disks; S. Hattori et al IEEE Transactions on Magnetics, vol. MAG-15, Nov. 6, 1979, pp. 1549-1551.

New preparation process for sputtered $\gamma$-Fe$_2$O$_3$ thin film disks Y. Ishii et al; IEEE Transactions on Magentics, vol. MAG-16, No. 5, Sep.; pp. 1114-1116.

Preparation of thin films in the system $\gamma$Fe$_2$O$_3$-Fe$_2$3 for recording media by spray pyrolysis of organometallic solutions using an ultrasonic pump; Michel Langlet et al; IEEE Transactions on Magnetics, vol. MAG-22, No. 3, May 1986, pp. 151-156.

Roadmap for 10 Gbit/in$^2$ Media: Challenges; Edward S. Murdock et al IEEE Transactions on Magnetics, vol. 28, No. 5, Sep. 1992, pp. 3078-3083.

*Primary Examiner*—Bernard Pianalto
*Attorney, Agent, or Firm*—Christie, Parker & Hale

[57] ABSTRACT

A method for preparing a magnetic recording medium includes the steps of providing a substrate, providing an alloy composite target attaching thereon Co and Fe pellets to modify the composition of this magnetic recording medium, and utilizing the target to form a (Co,Mn) modified $\gamma$-Fe$_2$O$_3$ thin film on the substrate under controlled conditions. Such method can provide a magnetic recording medium which is cost-effective and has a better SNR, a better resistance to corrosion and a high coercivity.

20 Claims, 4 Drawing Sheets

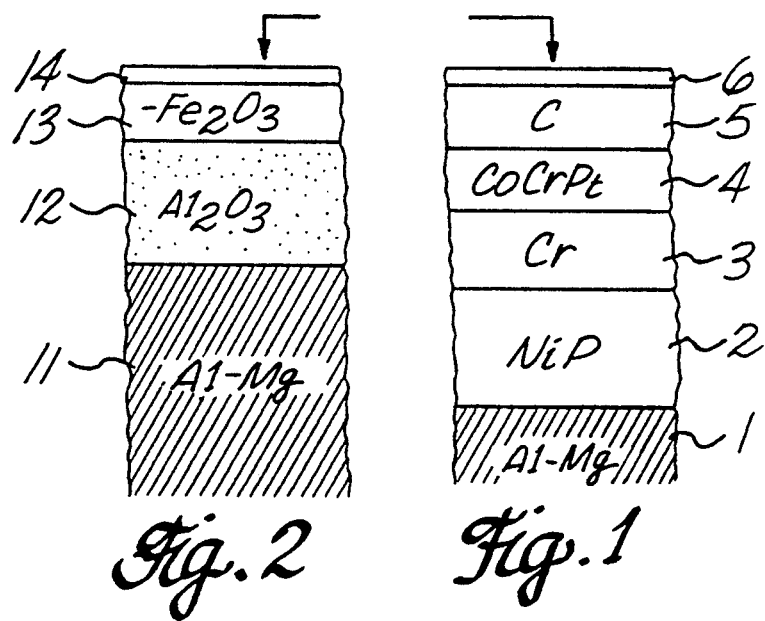

METHOD FOR PREPARING A MAGNETIC RECORDING MEDIUM

FIELD OF THE INVENTION

The present invention relates generally to a method for preparing a magnetic recording medium. The method is suitable to form a (Co,Mn) modified $\gamma$-$Fe_2O_3$ thin film for high density recording.

BACKGROUND OF THE INVENTION

At present, a hard disk is generally a thin film disk utilizing the longitudinal recording technology. The magnetization direction of the magnetic recording medium is in a longitudinal arrangement. The data read/write is achieved by use of a magnetic head or heads which slide(s) on the surface of the thin film, and utilize(s) a coil for dealing with a magnetic moment induction, or for generating a magnetic field by connecting to a current source in order to alter the magnetization direction of the magnetic moment. The hard disk arranged in such a manner is used in the so-called Winchester disk drive, and plays an important role on the commercial hard disk market.

So far, the relevant technologies disclosed in the literature researching the materials and preparing methods for magnetic recording thin films mainly include the longitudinal recording, perpendicular recording, and magneto-optic recording technologies. The metal sputtering method is generally used in these technologies. In the case of the longitudinal magnetic recording, its typical preparing method is shown in FIG. 1, and the CoCrM (M=Ni, Pt or Ta) series nowadays is the most popular materials system used for the metal sputtering. The sputtered metal thin film has a coercivity up to about 1500 Oe, a saturation magnetization Ms up to about 600–1200 emu/$cm^3$, a squareness ratio S of at least about 0.8, and a thickness of about 50 nm. Although these properties are all far superior to those of other kinds of materials, the metal thin film for magnetic recording still has the following drawbacks:

1) The alloys 4 in this series except the CoPt alloy do not have a strong crystalline anisotropy and high coercivity on the film surface, and thus a Cr (chromium) underlayer 3 is needed to help the crystalline growth of the magnetic layer, thereby the magnetocrystalline anisotropy and coercivity being enhanced. According to current researches, the magnetic properties and the grain size of such films are strongly affected by the thickness of the Cr underlayer 3, especially when the Cr underlayer 3 is relatively thin.

2) Since the hardness of the metal thin film is insufficient, an NiP layer 2 must be first plated on a substrate 1 by a non-electroplating method to strengthen the surface hardness. However, if the temperature of the substrate 1 is over 300° C. during the later processes, the amorphous NiP will crystallize to form a soft magnetic thick film. This will increase the noise of the magnetic thin film, and thus adversely affect the data read/write operations.

3) Since the metal thin film easily suffers from corrosion, an amorphous carbon film 5 acting as a protection layer is needed to prolong its lifetime.

4) The metal thin film with cobalt-based alloy contains more than 60 wt % Co. Since cobalt is a military supply, and expensive, the cost of the prepared thin film is very high. As to the non-electroplated CoP and CoNiP films, although their preparing processes are simpler and more economical, they are not suitable to be prepared into thin films for high density recording due to their bad magnetic property, inhomogeneity, and bad bonding strength. At present, the evaporated metal thin films are only applied to the magnetic tapes, and are immature for the hard disks.

With greatly and rapidly progressing in technologies, new thin film disk technologies are proposed one after another. For example, the perpendicular recording and magneto-optic recording technologies which both have the advantage of large recording capacity attract many attentions in this field, and threaten the market of the longitudinal recording technology of the conventional hard disk. In addition, the trends of being more light, thinner, shorter, and more miniaturized in technical products also push the makers to increase the recording capacity for the hard disk.

In order to act as a longitudinal magnetic recording thin film having a high recording density, the following requirements should be meeted with: 1. The magnetic recording material must have a high coercivity (Hc) at least higher than 1000 Oe; 2. The residual magnetization thereof (Mr) has to be sufficiently high; 3. The thickness of the magnetic thin film has to be decreased in order to lower the demagnetization interaction among the magnetic areas of the thin film; and 4. The thin film must have a high signal to noise ratio (SNR).

Since IBM successfully developed a magnetic recording technology for 1 Gb/$in^2$ areal density in 1990 (as described in the paper: T. Yogi et al., IEEE Trans. Magn., MAG-26, (1990), 2271), it is predicted that magnetic recording products with areal density of 10 Gb/in will become possible by the year of 2010 (as described in the paper: E. S. Murdock, IEEE Trans. Magn., MAG-28, (1992), 3078). There will be five possible designs for the needed recording media then. The lowest required coercivity is about 2500 Oe, and the highest is about 4500 Oe. The Mr$\delta$ of the former has to reach about 1.0 memu/cm, and the latter only about 0.35 memu/$cm^2$. From this trend, we can find that high Hc (coercivity) thin films will be eagerly required in the near future.

In order to best understand the iron-oxide thin film, the following papers may be referred to. The paper: E. T. Wuori and D. E. Speliotis, "Plating in the Electronic Industry", 3rd symposium, (1971), 315, disclosed an iron thin film formed by an evaporation method. The evaporated iron thin film is converted into an $\alpha$-$Fe_2O_3$ film by an oxidation treatment at temperature about 450°–500° C., and is then reduced to an $Fe_3O_4$ film in an $H_2$ and CO atmosphere. Another paper: R. L. Comstock and E. B. Moore, IBM J. Res. Dev. 18, (1974), 55, disclosed that an aqueous solution of $Fe(NO_3)_3 \cdot 9H_2O$ is sprayed to a preheated substrate at 300°–350° C. by a rotation deposition method to obtain an $\alpha$-$Fe_2O_3$ thin film, and then the $Fe_3O_4$ and $\gamma$-$Fe_2O_3$ thin films can be formed respectively by reduction and oxidation heat-treatments.

Prior researchers all concentrated on the phase synthesis, and did not dope any additives. Consequently, the resultant coercivity cannot be high, and can only reach about 200 Oe. Since 1977, some researchers proposed to utilize the technology of doping cobalt in the $\gamma$-$Fe_2O_3$ magnetic particulates to increase the coercivity of the formed thin film. The paper: M. Satuo et al., IEEE Trans. Magn., MAG-13, (1977), 1400, proposed an evaporation method for preparing a $Co_xFe_{3-x}O_4$ thin film. In this method, iron is first evaporated on a glass substrate, and converted into $\alpha$-Fe$_2$O$_3$ phase by oxidation at 400° C. Then, cobalt is evaporated thereon, and diffused into the $\alpha$-Fe$_2$O$_3$ film to form the Co$_x$Fe$_{3-x}$O$_4$ thin film by an annealing process in a vacuum. The coercivity of the resulting thin film is enhanced up to 700 Oe.

The enhancement of coercivity is so large that many researchers join in this field. The paper: S. Hattori et al., IEEE Trans. Magn., MAG-15, (1979), 1549, first proposed a reactive sputtering method which is able to successfully prepare an iron-oxide magnetic thin film with additives of Co and Ti. $\alpha$-Fe$_2$O$_3$ is first deposited in an Ar-O$_2$ atmosphere, is reduced to Fe$_3$O$_4$ in an H$_2$ atmosphere, and then is oxidized to $\gamma$-Fe$_2$O$_3$. The coercivity of the obtained thin film is about 700 Oe, the squareness ratio is about 0.8, and the recording density is about 1100 bits/Mm. This preparing method is the most popular process for manufacturing the iron-oxide series hard disk in industry.

Next year, the paper: S. Hattori et al., IEEE Trans. Magn., MAG-15, (1980), 1114, disclosed that the same researcher group as above further improvedly omitted one step of the preparing process. Fe$_3$O$_4$ is synthesized directly by a reactive sputtering method, and then is oxidized to obtain the $\gamma$Fe$_2$O$_3$. Its squareness ratio is increased to about 0.85, but its coercivity is slightly decreased to about 600 Oe. Therefore, the subsequent researchers seldom adopt this process while preferring to the above method (disclosed in 1979).

In 1984, O. Ishii and I. Hatakeyama in the above researcher group proposed, as disclosed in the paper: J. Appl. Phys. 55, (1984), 2269, a reactive sputtering method to dope Osmium (Os) into a ferrite magnetic thin film, and obtained a great break-through. They found that the doped Os can impart to the thin film several advantages of: 1. largely increasing the coercivity of the film to about 1920 Oe which cannot be reached by only doping the modifier Co; 2. being capable of efficiently suppressing the grain growth during later heat treatments so as to increase the SNR of the thin film, like in the case of doping Cu; 3. enhancing the coercivity up to about 2100 Oe after the annealing in a magnetic field (7 kOe); and 4. increasing the coercive squareness S* up to about 0.95, which is more efficient than that achieved by adding Ti. However, the worst drawback of this method is that the Osmium is too expensive. Therefore, a strong desire to further improve the ferrite magnetic thin film still exists in this field.

SUMMARY OF THE INVENTION

The primary object of the present invention is to provide a method for preparing a magnetic recording medium which is cost-effective because its main constituent is iron. Another object of the present invention is to provide a method for preparing a magnetic recording medium having a better SNR.

Still another object of the present invention is to provide a method for preparing a magnetic recording medium having a better resistance to corrosion.

Further object of the present invention is to provide a method for preparing a magnetic recording medium having a coercivity higher than 1000 Oe by doping cobalt and manganese, and by appropriate heat treatment conditions. In accordance with the present invention, a method for preparing a magnetic recording medium comprises the steps of: providing a substrate; providing an alloy composite target attaching thereon Co and Fe pellets to modify the composition of said magnetic recording medium; and forming a (Co,Mn) modified $\gamma$-Fe$_2$O$_3$ thin film on the substrate under controlled conditions.

In accordance with one aspect of the present invention, the substrate may be a silicon substrate, a glass substrate, or a metal substrate, on which an Al$_2$O$_3$ underlayer may be plated to strengthen its surface hardness. The present invention utilizes a DC (direct current) or RF (radio frequency) magnetron sputtering. The target is formed by manganese and iron both having a purity of about 99.7%, and the composition adjustment of the magnetic recording medium thin film is achieved by attaching the iron and cobalt pellets with a purity about 99.9% on the target. The compositions of the magnetic thin film represented by weight percentage of cations include 0–20 wt % Co, 0–18.5 wt % Mn, and 61.5–99.5 wt % Fe to be added to 100%, and preferably include 6–12 wt % Co, 0.1–6 wt % Mn, and 61.5–99.5 wt % Fe. Since the prepared magnetic thin film must have $\gamma$-Fe$_2$O$_3$ and/or Fe$_3$O$_4$ phases, the magnetic thin film is provided with a first step of heat treatment by which an $\alpha$-Fe$_2$O$_3$ can be reduced to an Fe$_3$O$_4$ at a constant temperature of about 200°–350° C. (or of preferably about 300°–340° C.) in an H$_2$ atmosphere for about 0.1–2 hours (or for preferably about 0.5–1 hour). The magnetic thin film is further provided with a second step of heat treatment, by which the thin film is subject to about 300°–400° C. (or to preferably about 340°–380° C.) in air for about 0.1–4 hours (or for preferably about 0.5–2 hours) to obtain a $\gamma$-Fe$_2$O$_3$ phase. In order to obtain a magnetic thin film with a high coercivity of more than 3000 Oe, the second step of heat treatment is additionally followed by a third step of heat treatment by which the thin film is subject to a post-annealing temperature of about 300°–380 ° C. (or of preferably about 340°–380° C.) to be oxidized in air for about 0.1–10 hours (or for preferably about 2–8 hours). The resultant magnetic thin film has a thickness of about 30–500 nm, a coercivity of about 900–4000 Oe (or of preferably about 1200–2000 Oe), a saturation magnetization of about 44–310 emu/cm$^3$ (or of preferably higher than about 200 emu/cm$^3$), and a squareness ratio of about 0.47–0.90 (or of preferably higher than about 0.7). Finally, the magnetic thin film film is covered with a lubricating layer to prevent the read/write head from being easily worn.

The present invention can be more fully understood by reference to the following description and accompanying drawings, which form an integral part of this application.

BRIEF DESCRIPTION OF THE DRAWINGS

FIG. 1 shows the structure of a conventional metal thin film;

FIG. 2 shows the structure of a ferrite thin film according to one preferred embodiment of the present invention;

DETAILED DESCRIPTION OF THE PREFERRED EMBODIMENTS

Figure 3:
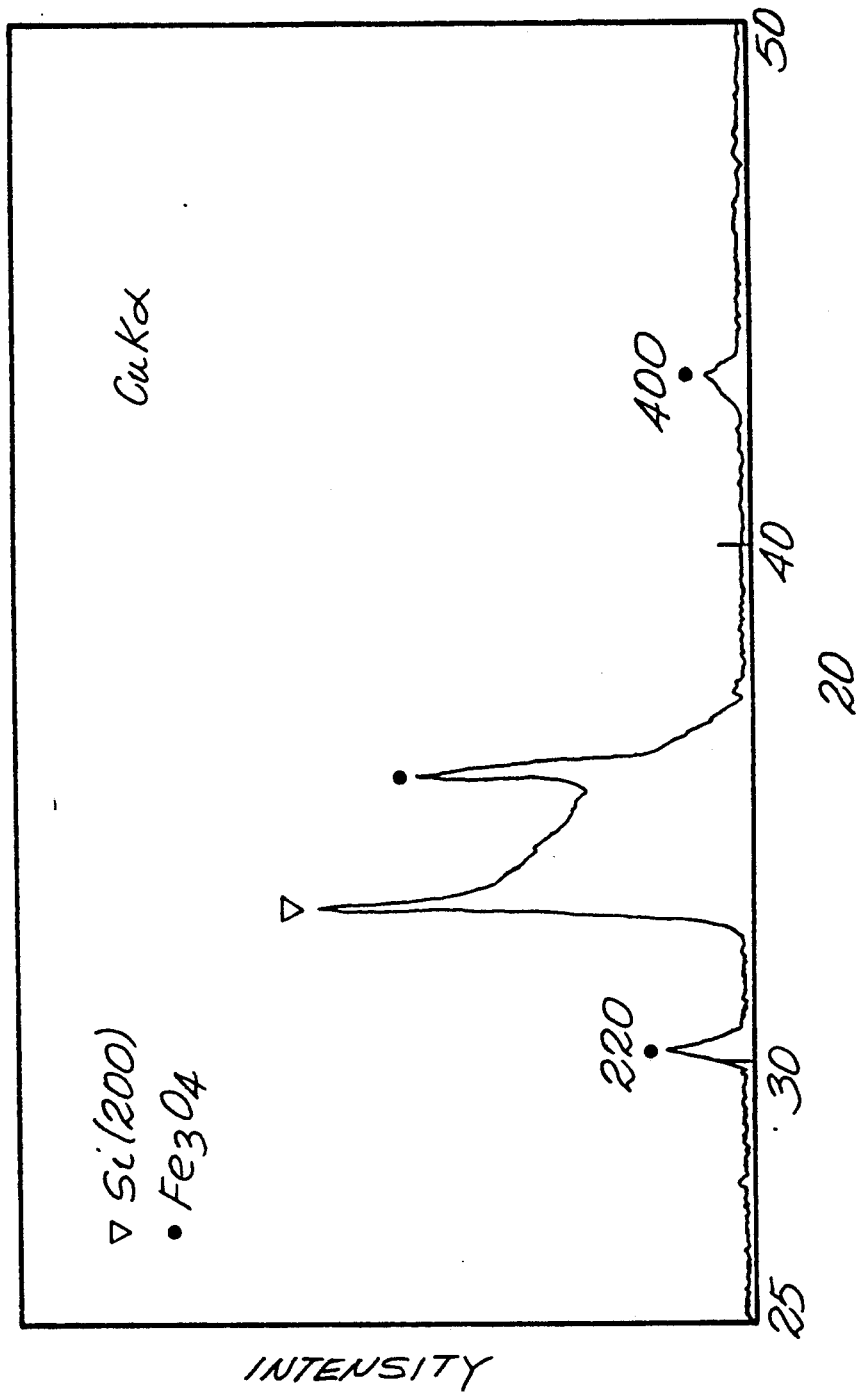
FIG. 3 is an X-ray diffraction pattern of a Fe$_3$O$_4$ phase thin film prepared by one experimental example of the present invention.

Referring to FIG. 2, there is shown the structure of a ferrite thin film prepared by the method of the present invention. Such a structure can overcome the above-described drawbacks of the metal films shown in FIG. 1.

The reasons are as follows:

1) The magnetic properties of the thin film are closely related to its composition, but hardly related to the $Al_2O_3$ underlayer grown by an anodic treatment.

2) An $Al_2O_3$ underlayer 12 is utilized to strengthen the surface hardness of the thin film, but the $Al_2O_3$ is a non-magnetic phase, so that the noises will not be increased.

3) The ferrite is a very stable material with good corrosion resistance, and thus there is no corrosion protection layer needed in the present invention.

4) The magnetic recording medium of the present invention is mostly iron, and only includes a relatively small amount of the expensive metal. Therefore, its cost is relatively low. The present invention utilizes the reactive sputtering method which can prepare a thinner film with excellent bonding property. Also, the present inventors discover that the modification of the weight percentages of cobalt (Co), manganese (Mn), and iron (Fe) ions, as well as the appropriate heat treatment conditions can be utilized to prepare a (Co,Mn) modified ferrite thin film with a high coercivity. This can overcome the low-coercivity (lower than 1000 Oe) problem of the above-mentioned papers disclosing the additions of cobalt, titanium, and copper ions, and can prepare a magnetic thin film having a coercivity up to about 4000 Oe without using the expensive osmium. Therefore, the present method is cost-effective, and can produce a relatively high quality thin film.

Elements or modifiers such as Co and Mn are added to control the coercivity of a magnetic thin film for high density recording. Referring to FIG. 2, the preparing method of the present invention comprises the steps of: providing a substrate 11; providing an alloy composite target attaching thereon Co and Fe pellets to modify the composition of said magnetic recording medium; and forming a (Co,Mn) modified $\gamma$-$Fe_2O_3$ thin film 13 on the substrate 11 under controlled conditions.

The substrate may be a silicon substrate, a glass substrate, or a metal substrate, on which an $Al_2O_3$ underlayer 12 may be plated to strengthen its surface hardness. In one preferred embodiment, the present invention utilizes an n-type [$SiO_x$/Si(100)] wafer and a Corning #7059 glass substrate (supplied by Corning Co.) which both have an optical quality flatness. The substrate is cut by a diamond knife to form a size of $0.5 \times 0.5$ in$^2$. Then, the substrate is cleaned up by an acetone for 5 minutes in an ultrasonic cleaner to remove its surface greases, and by a deionized water for 5 minutes in the ultrasonic cleaner to remove the organic solvent on its surface. Finally, the substrate is dried by a nitrogen gun.

The present invention utilizes a DC (direct current) or RF (radio frequency) magnetron sputtering procedure. In order to let the magnetic field of a magnet efficiently facilitate the sputtering process, the target preferably has not magnetic conductivity to allow the magnetic line of force to pass therethrough for achieving the magnetic control effect. Since the iron and cobalt used in the present invention both have a high magnetic conductivity, the alloy target has to be provided by a special manner. An electric balance is used to weigh electrolytic iron and electrolytic manganese both having a purity higher than about 99.7%. The total weight of the alloy is 150 g, and the weight ratio of iron to manganese is 3:1. According to the phase diagram, such a composition is of $\gamma$-Fe non-magnetic phase at room temperature, and thus can solve the problem of magnetic conductivity of the target. The weighed material is then put into an alumina crucible, molten in air by a RF power supply, and slowly cooled. The molten target is lathed to form a circular pole of 1 inch diameter by a lathe, and is cut to form circular plates of 2.5 mm thickness by a water-cooled cutting-off machine. From the ICP analysis, the composition of the formed circular plate in weight percentage is Fe:Mn=77:23, which is close to the original ratio. The composition adjustment of the magnetic recording medium thin film is achieved by attaching thereon the iron and cobalt pellets with a purity of about 99.9%.

The vacuum sputtering equipment used in the present invention is the same to the conventional sputtering system. The ultimate pressure of the pumping system in ideal condition can reach $2 \times 10^{-8}$ Torr. Before pumping to vacuum, the target is inserted beneath the sputtering gun, and the substrate is also placed on the appropriate position of a disc holder. The vacuum chamber is pumped coarsely to a pressure of $5 \times 10^{-2}$ Torr, and then the quartz lamp beneath the base is turned on for heating. When the pressure reaches $1 \times 10^{-2}$ Torr, the coarse pumping valve is closed, and a high vacuum pumping begins. When the pressure reaches $1 \times 10^{-5}$ Torr, the sputtering process can be started. A presputtering is utilized to clean up the surface of the target, and the clean surface can be used for deposition. The presputtering conditions are different with different systems. In this system, an argon (Ar) of 15 mTorr is introduced, and the power output of the DC power supply is set to 30 watts for 10 minutes. The current is close to a constant value then. The sputtering rate is kept unchanged, and the shutter located above the substrate is opened to deposite a thin film. The sputtering may be a DC-reactive or RF-reactive magnetron sputtering. It is known by those skilled in the art that the sputtering conditions are quite different with different systems. Therefore, the sputtering conditions described in the examples here do not be intended to limit the present invention, and may be changed as desired by those skilled in the art without departing the spirit and scope of the present invention.

The compositions of the magnetic thin film represented by weight percentage of cations include 0-20 wt % Co, 0-18.5 wt % Mn, and 61.5-99.5 wt % Fe to be added to 100%, and preferably include 6-12 wt % Co, 0.1-6 wt % Mn, and 61.5-99.5 wt % Fe. Since the prepared magnetic thin film must have a $\gamma$-$Fe_2O_3$ and/or $Fe_3O_4$ phases 13, the magnetic thin film is provided with a first step of heat treatment by which an $\alpha$-$Fe_2O_3$ phase can be reduced to an $Fe_3O_4$ phase at a constant temperature of about 200°-350° C. in an $H_2$ atmosphere for about 0.1-2 hours. More specifically, the first step of heat treatments is preferably executed at a constant temperature of about 300°-340° C. in an $H_2$ atomosphere for about 0.5-1 hour. The magnetic thin film is further provided with a second step of heat treatment, by which the thin film is subject to about 300°-400° C. (or preferably about 340°-380° C.) in air for about 0.1-4 hours (or preferably about 0.5-2 hours) to obtain a $\gamma$-$Fe_2O_3$ phase. In order to obtain a magnetic thin film with a high coercivity of more than 3000 Oe, the second step of heat treatment is additionally followed by a third step of heat treatment by which the thin film is subject to a post-annealing temperature of about 300°–380° C. (or preferably about 340°–380° C.) to be oxidized in air for about 0.1–10 hours (or preferably about 2–8 hours). The resultant magnetic thin film has a thickness of about 30–500 n, a coercivity of about 900–4000 Oe (or preferably about 1200–2000 Oe), a saturation magnetization of about 44–310 emu/cm$^3$ (or preferably higher than about 200 emu/cm$^3$), and a squareness of ratio of about 0.47–0.90 (or preferably higher than about 0.7). Finally, the magnetic thin film is covered with a lubricating layer 14, as shown in FIG. 2, to prevent a crash of a read/write head.

From an X-ray diffraction analysis, it can be verified that the resultant thin film obtained from the above-described processes is a thin film with pure $\gamma$-Fe$_2$O$_3$ and Fe$_3$O$_4$ phases. The preparing method of the present invention utilizes the composition adjustment of alloys and appropriate heat treatment conditions to control the coercivity of the thin film. The sputtered thin film has excellent bonding strength and surface flatness to a mirror reflection extent. In addition, the thin film of iron-oxide series itself has high signal-to-noise ratio (SNR), and thus the present method is very suitable to prepare a magnetic thin film for high density recording.

In order to best understand the magnetic recording medium of the present invention, one example is described hereinafter for reference:

The metal weight percentages of the target are Fe:Co:Mn=96.4:2.4:1.2. The substrate is an n-type [SiO$_x$/Si(100)] wafer, and a DC-reactive magnetron sputtering is utilized. The sputtering conditions are as follows: The distance from the target to the substrate is 5 cm; the temperature of the substrate is kept at about 100° C.; the rotation speed of the substrate is 20 rpm; the partial pressure ratio for sputtering is Ar:O=1:1; the total pressure is set at 30 mTorr; the input power is set at 30 watts; and the working current is 70 mA. The as-deposited film is loaded into a furnace for a reduction heat treatment at about 300°–340° C. for one hour. After the furnace is cooled to room temperature, the obtained thin film has a coercivity of about 2250 Oe, a saturation magnetization of about 100 emu/cm$^3$, and a coercive squareness ratio of about 0.7. If this thin film further undergoes an oxidation heat treatment at 350°–400° C. for 2 hours, the resultant thin film, after slowly cooled, has a coercivity of about 1300 Oe, a saturation magnetization of about 55 emu/cm$^3$, and a squareness ratio of about 0.75.

Of course, those skilled in the art may modify the above-described example as follows:

1) According to the above-described example, only the silicon substrate is replaced by a Corning #7059 glass substrate, and the sputtering conditions remain unchanged. The as-deposited film is loaded into a furnace for a reduction heat treatment at about 300°–340° C. for one hour. After slowly cooled, the obtained thin film has a coercivity of about 2450 Oe, a saturation magnetization of about 105 emu/cm$^3$, and a coercive squareness ratio of about 0.68. If this thin film further undergoes an oxidation heat treatment at 350°–400° C. for 2 hours, the resultant thin film, after slowly cooled, has a coercivity of about 900 Oe, a saturation magnetization of about 45 emu/cm$^3$ and a squareness ratio of about 0.90.

Figure 4:
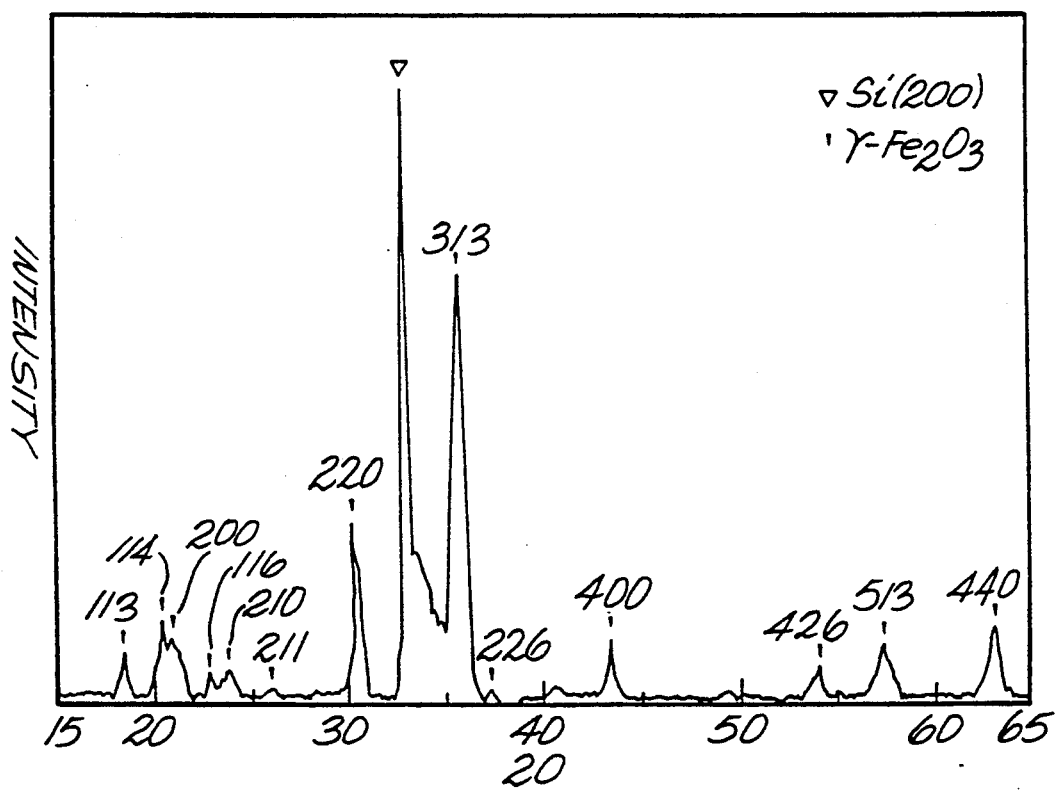
FIG. 4 is an X-ray diffraction pattern of a $\gamma$-Fe$_2$O$_3$ phase thin film prepared by another experimental example of the present invention.
Figure 5:
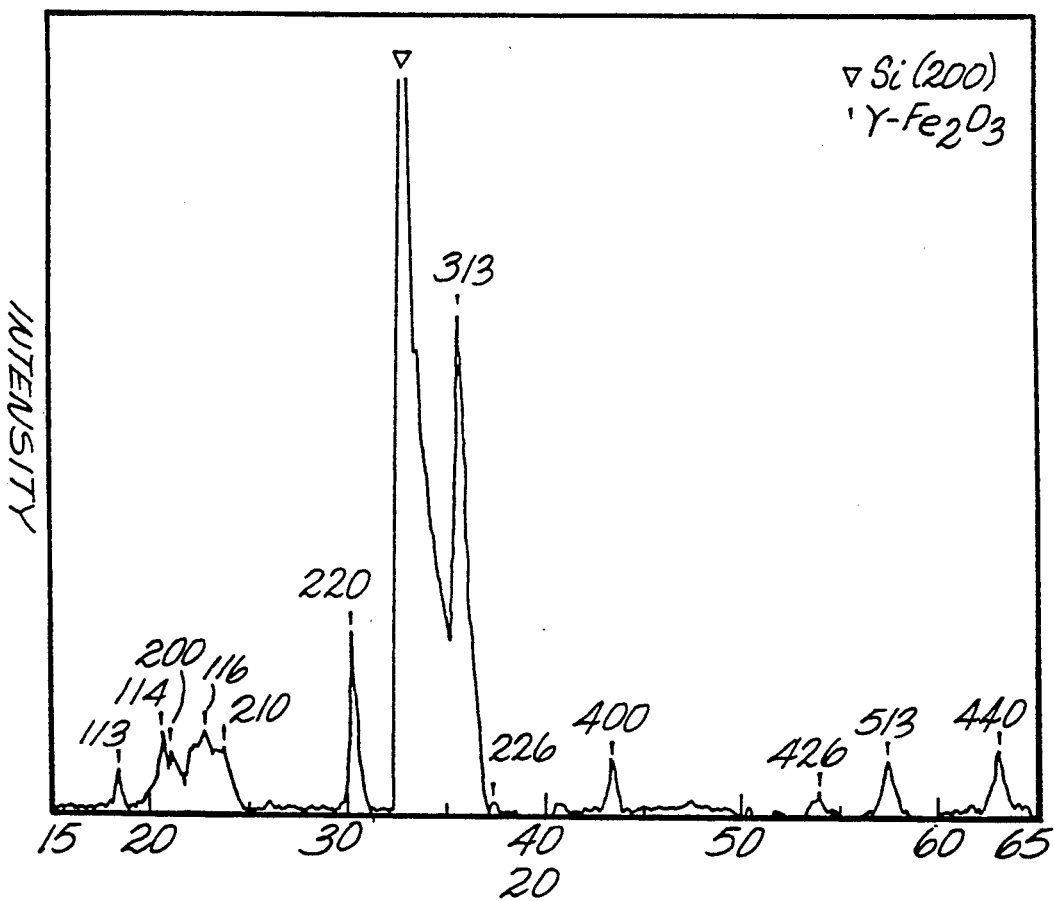
FIG. 5 is an X-ray diffraction pattern of the same $\gamma$-Fe$_2$O$_3$ phase thin film as in FIG. 4, after subjected to a post-annealing heat treatment.

2) According to the above-described example, only the metal weight percentages of the target are changed into Fe:Co:Mn=89.3:10.5:0.2, and the other situations remain unchanged. The as-deposited film is loaded into a furnace for a reduction heat treatment at about 300°–340° C. for one hour. After slowly cooled, the obtained thin film has a coercivity of about 1170 Oe, a saturation magnetization of about 260 emu/cm$^3$, and a squareness ratio of about 0.56. Referring to FIG. 3, there is shown an X-ray diffraction pattern of this thin film. After analysis, it is verified that the thin film is an Fe$_3$O$_4$ phase film. If this thin film further undergoes the oxidation heat treatment at 360°–400° C. for 2 hours, the resultant thin film, after slowly cooled, has a coercivity of about 3000 Oe, a saturation magnetization of about 310 emu/cm$^3$, and a squareness ratio of about 0.61. Referring to FIG. 4, there is shown an X-ray diffraction pattern of the thin film after oxidation. After analysis, it is verified that the thin film is a $\gamma$-Fe$_2$O$_3$ phase film. If this thin film further undergoes a post-annealing heat treatment at 340°–360° C. for 8 hours, the formed thin film, after slowly cooled, has a coercivity of about 3800 Oe, a saturation magnetization of 260 emu/cm$^3$, and a squareness ratio of 0.63. Referring to FIG. 5, there is shown an X-ray diffraction pattern of the thin film after post-annealing. After analysis, it is also verified that the thin film is a $\gamma$-Fe$_2$O$_3$ phase film.

3) According to the above-described example, the metal weight percentages of the target are Fe:Co:Mn=89.3:10.5:0.2, and the substrate is a Corning #7059 glass. The as-deposited film is loaded into a furnace for a reduction heat treatment at about 300°–340° C. for one hour. After slowed cooled, the obtained thin film has a coercivity of about 1020 Oe, a saturation magnetization of about 270 emu/cm$^3$, and a squareness ratio of about 0.62. If this thin film further undergoes an oxidation heat treatment at 360°–380° C. for 2 hours, the resultant thin film, after slowly cooled, has a coercivity of about 2700 Oe, a saturation magnetization of about 290 emu/cm$^3$, and a squareness ratio of about 0.9. if this thin film further undergoes a post-annealing heat treatment at 340°–360° C. for 8 hours, the formed thin film, after slowly cooled, has a coercivity of about 4000 Oe, a saturation magnetization of 255 emu/cm$^3$, and a squareness ratio of 0.83.

In order to best understand the magnetic recording medium of the present invention, another example is further described hereinafter for reference:

The metal weight percentages of the target are Fe:Co:Mn=79.5:10.5:10.0. The substrate is an n-type [SiO$_x$/Si(100)] wafer, and a RF-reactive magnetron sputtering is utilized. The sputtering conditions are as follows: The distance from the target to the substrate is 5 cm; the temperature of the substrate is kept at about 100° C.; the rotation speed of the substrate is 20 rpm; the partial pressure ratio for sputtering is Ar:O$_2$=1:1; the total pressure is set at 30 mTorr; the input power is set at about 50 watts; and the working current is 70 mA. The as-deposited film is loaded into a furnace for a reduction heat treatment at about 300°–340° C. for one hour. After slowly cooled, the obtained thin film has a coercivity of about 1200 Oe, a saturation magnetization of about 200 emu/cm$^3$, and a squareness ratio of about 0.45. If this thin film further undergoes an oxidation heat treatment at 360°–380° C. for 2 hours, the resultant thin film, after slowly cooled, has a coercivity of about 2700 Oe, a saturation magnetization of about 128 emu/cm$^3$, and a squareness ratio of about 0.45.

Of course, the above-described example may be modified as follows:

1) According to the above-described example, only the silicon substrate is changed into a Corning #7059 glass substrate, and the other conditions remain unchanged. The as-deposited film is loaded into a furnace for a reduction heat treatment at about 300°–340° C. for one hour. After slowly cooled, the obtained thin film has a coercivity of about 1050 Oe, a saturation magnetization of about 205 emu/cm$^3$, and a squareness ratio of about 0.47. If this thin film further undergoes an oxidation heat treatment at 360°–400° C. for 2 hours, the resultant thin film, after slowly cooled, has a coercivity of about 2520 Oe, a saturation magnetization of about 115 emu/cm$^3$, and a squareness ratio of about 0.48.

2) According to the above-described example, only the metal weight percentages of the target are changed into Fe:Co:Mn=1.0:10.5:18.5, and the other situations remain unchanged. The as-deposited film is loaded into a furnace for a reduction heat treatment at about 300°–340° C. for one hour. After slowly cooled, the obtained thin film has a coercivity of about 1400 Oe, a saturation magnetization of about 150 emu/cm$^3$, and a squareness ratio of about 0.43. If this thin film further undergoes an oxidation heat treatment at 360°–400° C. for 2 hours, the resultant thin film, after slowly cooled, has a coercivity of about 2650 Oe, a saturation magnetization of about 150 emu/cm$^3$, and a squareness ratio of about 0.30.

3) According to the above-described example, the metal weight percentages of the target are changed into Fe:Co:Mn=71.0:10.5:18.5, the substrate is also changed into a Corning #7059 glass, and the other conditions remain unchanged. The as-deposited film is loaded into a furnace for a reduction heat treatment at about 300°–340° C. for one hour. After slowly cooled, the obtained thin film has a coercivity of about 1350 Oe, a saturation magnetization of about 165 emu/cm$^3$, and a squareness ratio of about 0.41. If this thin film further undergoes an oxidation heat treatment at 360°–400° C. for 2 hours, the resultant thin film, after slowly cooled, has a coercivity of about 2200 Oe, a saturation magnetization of about 145 emu/cm$^3$, and a squareness ratio of about 0.33.

While the invention has been described in terms of what are presently considered to be the most practical and preferred embodiments, it is to be understood that the invention needs not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for preparing a magnetic recording medium comprising the steps of:
    (a) providing a substrate;
    (b) providing an Fe-Mn alloy target formed of manganese and iron having a purity of about 99.7% and attaching thereon Co and Fe pellets to modify a composition of said magnetic recording medium; and
    (c) depositing said target by one of an RF-reactive magnetron sputtering and a DC-reactive magnetron sputtering methods to form a magnetic recording medium thin film on said substrate under controlled conditions.

2. A method according to claim 1 wherein said substrate is a silicon substrate.

3. A method according to claim 1 wherein said substrate is a glass substrate.

4. A method according to claim 1 wherein said substrate is a metal substrate.

5. A method according to claim 1 wherein said substrate has a surface covered with an Al$_2$O$_3$ layer in order to improve a surface hardness thereof.

6. A method according to claim 1 wherein said magnetic thin film is covered by a lubricating layer.

7. A method according to claim 1 wherein said magnetic thin film has a thickness of about 30 to 500 nm, a coercivity of about 900 to 4000 Oe, a saturation magnetization of about 44 to 310 emu/cm$^3$, and a squareness ratio of about 0.47 to 0.90.

8. A method according to claim 7 wherein said magnetic thin film preferably has a coercivity of about 1200 to 2000 Oe, a saturation magnetization of about 200 emu/cm$^3$, and a squareness ratio higher than 0.7.

9. A method according to claim 1 wherein Co and Fe pellets are respectively prepared by Co and Fe metals having a 99.9 percent purity.

10. A method according to claim 1 wherein said magnetic thin film is formed with by cation weight 0–20% Co, 0–18.5% Mo, and 61.5–99.5% Fe.

11. A method according to claim 10 wherein said magnetic thin film is preferably formed with by weight 6–12% Co, 0.1–6% Mn, and 61.5–99.5% Fe.

12. A method according to claim 1 wherein said magnetic thin film is in a phase of $\gamma$-Fe$_2$O$_3$.

13. A method according to claim 1 wherein said magnetic thin film is in a phase of $\gamma$-Fe$_3$O$_4$.

14. A method according to claim 1 wherein said magnetic thin film is in phases of $\gamma$-Fe$_2$O$_3$ and Fe$_3$O$_4$.

15. A method according to claim 1 wherein said magnetic thin film is provided with a first step of heat treatment, by which an $\alpha$-Fe$_2$O$_3$ can be reduced to an Fe$_3$O$_4$ at a constant temperature of about 200°–350° C. in an H$_2$ atmosphere for about 0.1 to 2 hours.

16. A method according to claim 15 wherein said first step of heat treatment is preferably executed at a constant temperature of about 300° to 340° C. in an H$_2$ atomosphere for about 0.5 to 1 hour.

17. A method according to claim 15 wherein said magnetic thin film is further provided with a second step of heat treatment, by which said thin film is subject to a temperature of about 300° to 400° C. in air for about 0.1 to 4 hours to have a $\gamma$-Fe$_2$O$_3$ phase.

18. A method according to claim 17 wherein said second step of heat treatment is preferably executed at a temperature of about 340° to 380° C. in air for about 0.5 to 2 hours.

19. A method according to claim 17 wherein said second step of heat treatment is additionally followed by a third step of heat treatment, by which said thin film is subject to a post-annealing temperature of about 300° to 380° C. to be oxidized in air for about 0.1 to 10 hours to form said magnetic thin film with a coercivity of more than 3000 Oe.

20. A method according to claim 19 wherein said third step of heat treatment is preferably executed in an post-annealing temperature of about 340° to 380° C. to be oxidized in air for about 2 to 8 hours.

* * * * *

UNITED STATES PATENT AND TRADEMARK OFFICE
CERTIFICATE OF CORRECTION

PATENT NO. : 5,294,312                           Page 1 of 3
DATED : March 15, 1994
INVENTOR(S) : Tsung-Shune Chin; Wei-Der Chang; Ming-Cheng Deng It is certified that error appears in the above-indentified patent and that said Letters Patent is hereby corrected as shown below:

Title page, item

[56] References Cited, OTHER PUBLICATIONS, Lines 13,14, after "Y. Ishii et al;" change "IEEE Transactions on Magentics" to -- IEEE Transactions on Magnetics --.

Column 1, line 34, change "materials" to -- material --.

Column 2, lines 7-11, delete "With greatly and rapidly progressing in technologies, new thin film disk technologies are proposed one after another. For example, the perpendicular recording and magneto-optic recording technologies which both have the advantage of large recording capacity attract many attentions in this field, and threaten the market of the longitudinal recording technology of the conventional hard disk."

and insert therefor

-- With great and rapid progress in technology, new thin film disk technology is proposed one after another. For example, the perpendicular recording and magneto-optic recording technology, which has the advantage of large recording capacity, attracts much attention in this field and threatens the market of the longitudinal recording technology of the conventional hard disk. --

UNITED STATES PATENT AND TRADEMARK OFFICE
CERTIFICATE OF CORRECTION

PATENT NO. : 5,294,312

DATED : March 15, 1994

INVENTOR(S) : Tsung-Shune Chin; Wei-Der Chang; Ming-Cheng Deng

It is certified that error appears in the above-indentified patent and that said Letters Patent is hereby corrected as shown below:

```
Column 2, line 14, change "light" to -- lighter --.
Column 2, line 16, change "push" to -- pushes --.
Column 2, line 20, change "meeted" to -- met --.
Column 2, line 40, change "memu/cm" to -- memu/cm² --.

Column 3, line 28, change "preferring" to
          -- referring --.

Column 4, line 46, delete "film" (second occurrence).
Column 4, line 60, after "pattern of" change "a"
          to -- an --.
Column 4, line 67, before "subjected" insert
          -- being --.

Column 5, line 7, after "metal" change "films"
          to -- film --.
Column 5, line 15, change "noises" to -- noise --.
Column 5, line 64, before "magnetic" change "not"
          to -- no --.

Column 6, line 10, before "RF" change "a" to -- an --.
Column 6, line 23, change "condition" to
          -- conditions --.
Column 6, line 41, change "deposite" to -- deposit --.
Column 6, line 46, change "do not be" to -- are not --.
Column 6, line 48, after "departing" insert -- from --.
Column 6, line 62, change "atomosphere" to
          -- atmosphere --.
Column 7, line 8, after "30-500" change "n"
          to -- nm --.
Column 7, line 11, before "ratio" delete "of".
```

UNITED STATES PATENT AND TRADEMARK OFFICE
CERTIFICATE OF CORRECTION

PATENT NO. : 5,294,312
DATED : March 15, 1994
INVENTOR(S) : Tsung-Shune Chin; Wei-Der Chang; Ming-Cheng Deng It is certified that error appears in the above-indentified patent and that said Letters Patent is hereby corrected as shown below:

Column 8, line 33, change "slowed" to -- slowly --.
Column 8, line 40, before "this" change "if" to -- If --.
Column 8, line 51, before "RF-reactive" change "a" to -- an --.

Column 9, line 18, change "Fe:Co:Mn=1.0:10.5:18.5" to -- Fe:Co:Mn=71.0:10.5:18.5 --.

Column 10, line 27, after "formed" delete "with".
Column 10, line 30, after "formed" delete "with".
Column 10, line 46, change "atomosphere" to -- atmosphere --.

Signed and Sealed this

Twenty-second Day of November, 1994

Attest:

BRUCE LEHMAN

*Attesting Officer*  *Commissioner of Patents and Trademarks*